United States Patent [19]

Flashman

[11] 4,147,229

[45] Apr. 3, 1979

[54] VIBRATILE MODE SPEAKER CABINET

[76] Inventor: Arthur L. Flashman, 139 Cocoa Pl., Cocoa, Fla. 32922

[21] Appl. No.: 842,045

[22] Filed: Oct. 14, 1977

[51] Int. Cl.[2] .......... H05K 5/00

[52] U.S. Cl. .......... 181/144; 181/148; 181/154; 181/157; 181/171; 181/199

[58] Field of Search .......... 181/144–148, 181/154, 157, 171, 199; 179/1 E

[56] References Cited

U.S. PATENT DOCUMENTS

| | | | |
|---|---|---|---|
| 2,476,572 | 7/1949 | Wenzel | 181/148 |
| 2,704,185 | 3/1955 | Tavares | 181/148 |
| 3,101,810 | 8/1963 | Doschek | 181/199 |
| 3,109,509 | 11/1963 | Klug | 181/156 |
| 3,150,739 | 9/1964 | Dones | 181/147 |
| 3,170,537 | 2/1965 | Sullivan et al. | 181/144 |
| 3,233,695 | 2/1966 | Hutchins | 181/156 |
| 3,238,302 | 3/1966 | Curchack | 179/1 E |
| 3,291,251 | 12/1966 | Lemrowski | 181/147 |
| 3,608,665 | 9/1971 | Drisi | 181/147 |

*Primary Examiner*—Stephen J. Tomsky

*Attorney, Agent, or Firm*—Richard D. Dixon

[57] ABSTRACT

This invention relates to a cabinet for audio reproduction speakers of the type which have a movable speaker cone mounted within a fixed speaker frame. The cabinet includes a plurality of external cabinet members juxtaposed to form a substantially rectangular cabinet having a rectangular void therein together with front and rear openings. Each of the external cabinet members is formed from a thin and acoustically stiff material for moving in a vibratile mode when energized. End sections of adjacent ones of the external cabinet members define therebetween isolation slots for permitting the independent vibratile mode of each of the external cabinet members. Nodal couplers span the isolation slots for transmitting vibratile energy between adjacent external cabinet members. The speakers are mounted within the rectangular void and are attached to at least one of the external cabinet members for coupling the vibrational energy from the frame of the speaker to the external cabinet member for energizing the vibrational mode thereof.

10 Claims, 6 Drawing Figures

VIBRATILE MODE SPEAKER CABINET

BACKGROUND OF THE INVENTION

I. Field of the Invention

This invention relates to sound reproduction structures and in particular to cabinet structures for loud speakers.

II. Description of the Prior Art

The conventional audio transducer or speaker comprises a conical metallic frame having at the apex thereof a permanent magnet. An electrically energized coil is forced to move with relationship to the permanent magnet as a result of current passing through the coil. This coil is connected to the apex of a conically shaped speaker cone which is movably coupled about the base thereof to the bottom section of the speaker frame. In this manner the speaker cone is driven back and forth with relationship to the permanent magnet and the frame of the speaker. Sound is radiated from the speaker cone as a result of the mechanical vibrations induced therein by the electro/mechanical transducer comprising the permanent magnet and coil. At the same time that sound is radiated from the speaker cone, additional vibrational energy is transmitted throughout the speaker frame. This vibrational energy is generally absorbed by a resiliant layer coupled between the speaker frame and the cabinet to which the speaker is attached.

The typical speaker cabinet comprises a top, a bottom and two side members together with a front and a back member. This combination of members forms a closed box, with the speakers generally being mounted on the front member for radiating their acoustical energy toward the listener. The typical speaker design requires a very firm attachment of edge sections of adjacent ones of the external speaker cabinet members in order to reduce the acoustical energy radiated therefrom as a result of the vibration of that member. The theory holds that only the speaker cone should radiate acoustical energy, since it is the only radiating element of the sound reproduction transducer which has its motion controlled by the electrical signal from the amplifier. Therefore, the typical speaker cabinet design requires various forms of internal support together with extensive edge reinforcement including edge-coupling adhesive substances for reducing the vibration of the external speaker cabinet members. In fact, some speaker enclosure designs have gone so far as to manufacture the external cabinet members of substances such as cement, earth, etc. which act as an infinite absorber and null radiator of acoustical energy.

In contrast with these prior art theories, the present invention recognizes that acoustical sounding boards are commonly used in other fine musical instruments such as guitars, violins, pianos, etc. These fine musical instruments are designed so that the prime source of acoustical energy, such as the strings of the piano, excite vibratile modes within the sounding board. These vibratile modes radiate additional acoustical energy which supplements and mellows the overall sound of the musical instrument as heard by the listener. This invention recognizes that if certain members of the speaker cabinet can be utilized as sounding boards, then the overall sound produced by the speaker together with its cabinet can be made more appealing in a psycho-acoustic sense.

This invention also recognizes that a significant portion of the electrical energy supplied to the electro-mechanical speaker transducer is dissipated in the form of vibrational energy produced by the movement of the cone of the speaker within the metalic frame. By coupling this vibrational energy from the speaker frame into the external members of the speaker cabinets, this normally dissipated vibrational energy, which is generally an accurate representation of the acoustical wave form produced by the speaker cone, is transmitted throughout the cabinet enclosure members and is thereby radiated as additional acoustic energy. This additional quantum of acoustical energy supplements the direct acoustical radiation from the speaker and increases the overall electrical to acoustical efficiency quotient of the system.

The prior art contains several examples of attempts by other inventors to utilize a vibratile sounding board to in some manner affect the tonal qualities of the speaker system. Hutchins in U.S. Pat. No. 3,233,695 discloses the use of a vibratile panel mounted internal to the speaker enclosure. This vibratile panel is designed to be driven substantially in phase with the speaker cone throughout a pre-selected low range of frequencies, thereby reinforcing the acoustical energy radiated over a specified frequency spectrum. This vibratile member is secured to the adjacent enclosure members by screws or other fastening means in conjunction with strips of foam rubber for dampening the edge motion of the vibratile panel. In this way the energy produced by the vibratile panel is not transferred to other elements of the speaker enclosure. The vibratile panel is designed to radiate only at low frequencies, and adds little to the high frequency qualities of the sound reproduction transducing system.

Klug in U.S. Pat. No. 3,109,509 discloses the use of a plurality of parellel transverse vibratile panels suspended within the speaker enclosure. These vibratile panels are coupled at one end thereof to the speaker cabinet by means of tensioned anchor springs. These vibratile panels coact with the walls of the speaker enclosure to accurately reproduce the recorded tones as well as amplifying the tones. The speaker cabinet, while formed of welded pieces of sheet metal, is of standard shape and construction.

Wenzel in U.S. Pat. No. 2,476,572 discloses the use of a plurality of vibratile panels which are independently suspended within the interior of the speaker enclosure. These vibratile panels reinforce the acoustical energy produced by the electro-magnetic speaker transducers in certain frequency ranges, predominately the bass or lower frequency portions thereof.

Drisi in U.S. Pat. No. 3,608,665 discloses the use of a plurality of speakers, each mounted on a planar surface of a pyramidal baffle. The rear end of the enclosure may be open to allow a rear directed radiation of acoustical energy from the electro-mechanical speaker element. This disclosure apparently does not utilize vibratile panels for modifying the tonal qualities of the acoustic spectrum generated by the system.

Other references which disclose concepts which are in part related to the theory of the present invention include the disclosures of Gerlach in U.S. Pat. No. 1,667,149, Duffy in U.S. Pat. No. 1,826,751, Brown in U.S. Pat. No. 2,058,407, Doubt in U.S. Pat. No. 2,602,860, Forrester in U.S. Pat. No. 2,646,852, Tavares in U.S. Pat. No. 2,704,185 and Eberhardt in U.S. Pat. No. 3,342,498. These prior art references add little to the references which have been previously discussed.

In contrast to the prior art references, the present invention utilizes a generally parallelopiped speaker enclosure having open back and front sections. The electro-magnetic speaker transducers are mounted within the rectangular void inside the enclosure for radiating their acoustical energy toward the front thereof. The vibrational energy produced by the motion of the speaker cone with reference to the speaker frame is transmitted through the speaker mounting elements to the external speaker cabinet members. Each of these external speaker cabinet members is allowed to vibrate in a periodic fashion which is sympathetic to the vibrational frequencies of the electro-magnetic speaker transducer. Furthermore, the edge sections of the adjacent external speaker cabinet members define therebetween isolation slots for allowing the maximum possible vibration excursion of the member in response to the energy transferred thereto. Nodal coupling blocks are utilized to transfer vibratile energy between adjacent ones of the external speaker cabinet members. The construction of these nodal coupling blocks will determine, at least in a general manner, the tonal characteristics produced by the sympathetic vibration of the external speaker cabinet members. These cabinet members may also be excited into their respectful vibratile modes by the incidence thereupon of acoustical energy produced by the electro-magnetic speaker transducer.

SUMMARY OF THE INVENTION

This invention relates to a cabinet for sound reproduction transducers of the type having fixed frames and movable cones attached thereto for being driven by electromagnetic forces to produce audible energy. The speaker cabinet comprises a plurality of external cabinet members, including a base member, a top member and said members, with each of the external cabinet members being constructed of a relatively thin and acoustically stiff material. Vibratile coupling means are provided for coupling the base member, the top member and the side members together as external surfaces of a unitary structure. The adjacent surfaces of the external cabinet members define therebetween isolation slots for permitting the independent vibratile modes of each of the external cabinet members when energized. Transducer mounting means are also provided for coupling the vibratile energy from the frame of the sound reproduction transducer to the external cabinet members for energizing the vibratile modes thereof. In this manner the audio energy radiated from the cone of the sound reproduction transducer will be supplemented by vibratile mode energy radiated from the external cabinet members.

BRIEF DESCRIPTION OF THE DRAWINGS

Other objects, features and advantages of the present invention will be apparent from a study of the written description and the drawings in which.

1.

DETAILED DESCRIPTION OF THE PREFERRED EMBODIMENT

Figure 1:
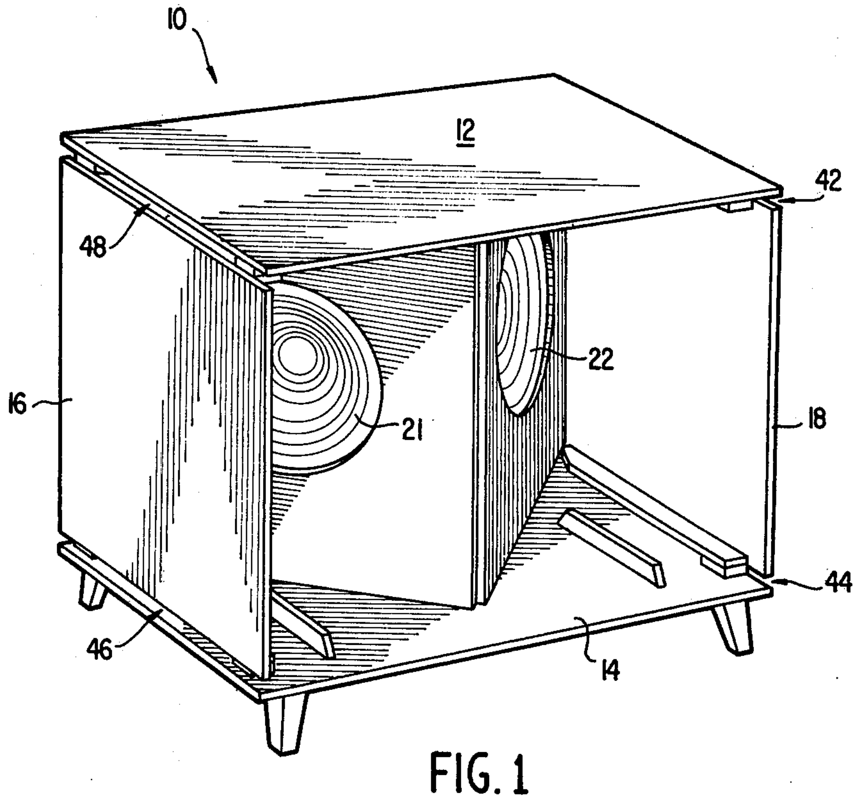
FIG. 1 illustrates a frontal perspective view of the speaker cabinet designed in accordance with the principals of the present invention.
2.

The present invention, illustrated generally as 10 in FIGS. 1, 2, 3 and 5, comprises an external cabinet for housing a pair of sound reproduction transducers, shown as 21 and 22 in the drawings.

The cabinet is formed as a unitary structure comprising a top member 12, a bottom member 14, a left side member 16, and a right side member 18. These members form a generally rectangular or parallelopiped external surface of the cabinet. These members also define a generally rectangular or parallelopiped void therein, shown generally as 30 in FIG. 2. The internal void 30 includes a front opening 32 and a rear opening 34.

Each of the external members, 12, 14, 16 and 18 is formed from a relatively thin and acoustically stiff material such as spruce. Other types of wooden materials, particle board and various high-strength materials may also be used to form these external cabinet members.

Each of the adjacent end surfaces of the external cabinet members 12, 14, 16 and 18 define therebetween generally elongated isolation slots shown generally as 42, 44, 46 and 48 in FIGS. 1, 3, 5 and 6. These isolation slots allow each of the distended ends of the external cabinet members to vibrate to full excursion when the entire member is energized. The size of the gap formed by the isolation slot is dependent upon the thickness and the type of material used for each of the external cabinet members. For example, if one-quarter inch sheets of spruce wood are chosen for the external cabinet members 12, 14, 16 and 18 then the gap of the isolation slot may vary between one-eighth of an inch to one-half of an inch, with a one-eighth inch gap being chosen as optimum for the preferred embodiment of the present invention.

Figure 6:
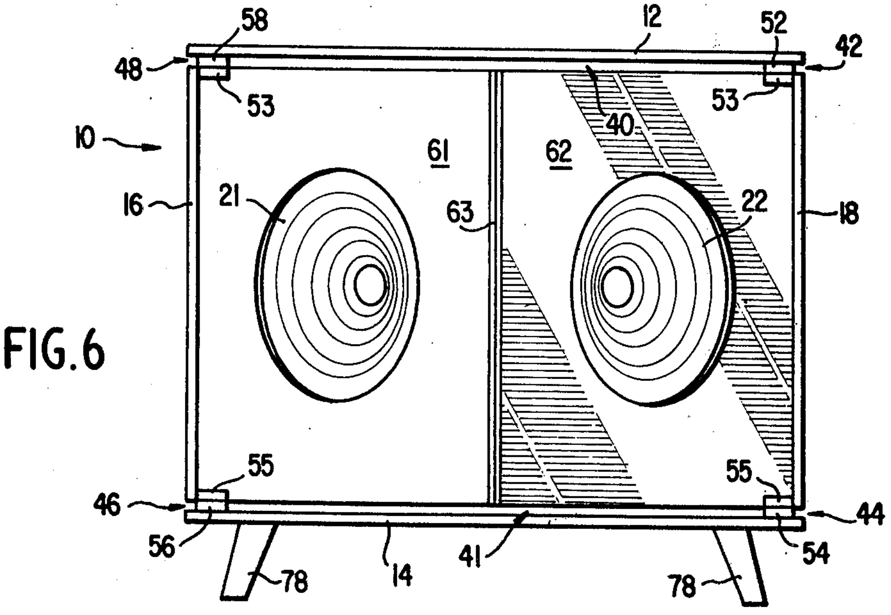
FIG. 6 is a front plan view of the speaker cabinet as shown in FIG. 1.

Paired nodal coupling blocks bridge each of the isolation slots defined between adjacent ones of the external cabinet members. As illustrated in FIG. 6, a front nodal coupling block 52 and a rear nodal coupling block 53 (not shown) comprise paired nodal coupling blocks which bridge the isolation slot 42 between the top member 12 and the right side member 18. Likewise, paired nodal coupling blocks 54 bridge the isolation slot 44 define between the right side member 18 and the bottom member 14; paired nodal coupling blocks 56 bridge the isolation slot 46 defined between the left side member 16 and the bottom member 14; and paired nodal coupling blocks 58 bridge the isolation slot 48 defined between the left side member 16 and the top member 12. These paired nodal coupling blocks may be attached either directly to the adjacent external cabinet members, or in the alternative they may be coupled to common side coupling slats 53 and 55 which are then attached directly to the appropriate external cabinet member.

Figure 2:
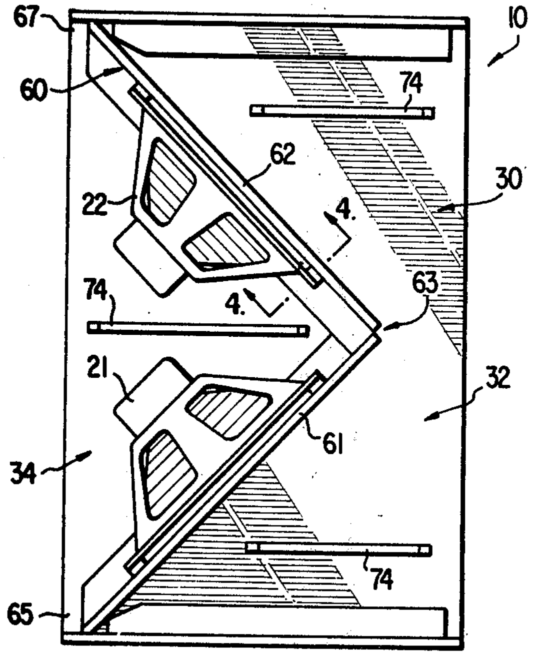
FIG. 2 is a top plan view of the cabinet shown in FIG. 1 with the top member of the cabinet removed.
3.
Figure 3:
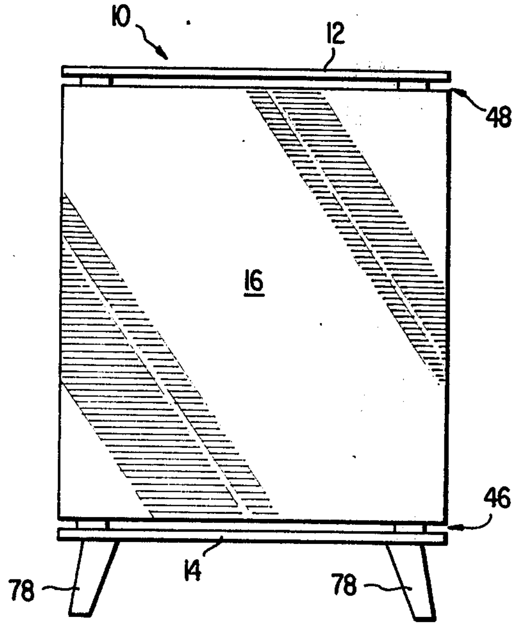
FIG. 3 is an end plan view of the speaker cabinet as shown in in FIG. 1.
4.
Figure 5:
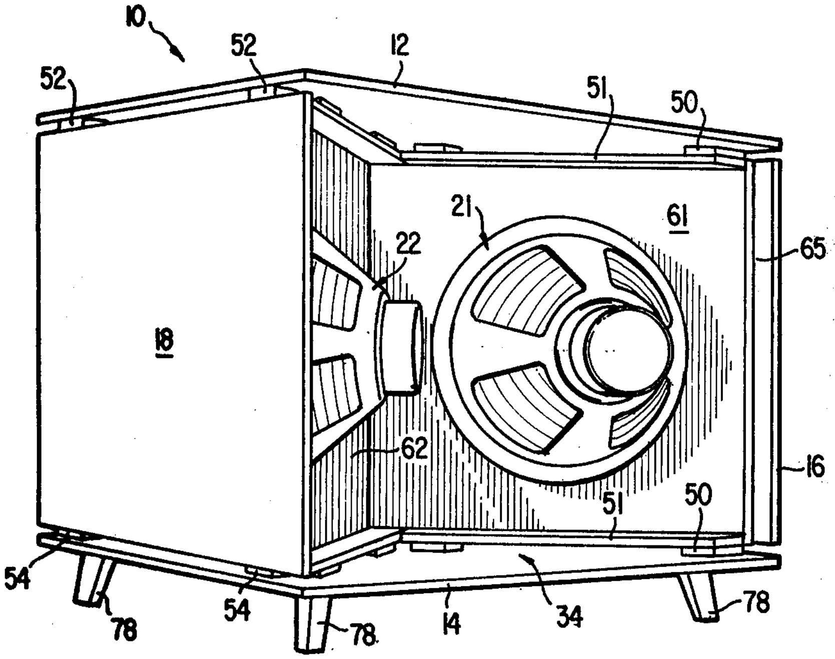
FIG. 5 is a rear perspective view of the speaker cabinet in accordance with the present invention.
6.

The speaker transducers 21 and 22 are each attached to a rear surface of an apex baffle wall, shown generally as 60 in FIG. 2. The apex baffle wall 60 includes a first baffle element 61 having the first speaker transducer 21 attached thereto, a second baffle wall 62 having the second speaker transducer 22 attached thereto and an apex section 63 formed by the 90 degree coupling between the first baffle wall 61 and the second baffle wall 62. The distended end of the first baffle wall 61 is coupled to the rear edge of the left side member 16 along a baffle edge coupling shown generally as 65 in FIG. 5. A similar baffle edge coupling is used to attach the second baffle wall 62 to a rear edge surface of the right side member 18. As illustrated in FIGS. 5 and 6, the upper edge surface of the first baffle wall 61 and the second baffle wall 62 are disposed adjacent to an inner surface of the top external cabinet member 12 and define therebetween a top isolation slot shown generally as 40. In a similar manner, a bottom isolation slot 41 is defined between the lower edge sections of the apex baffle wall 60 and the bottom external member 14 of the cabinet. Additional nodal coupling blocks 50 and additional coupling strips 51 may be used to bridge the top isolation slot 40 or the bottom isolation slot 41 as required.

Figure 4:
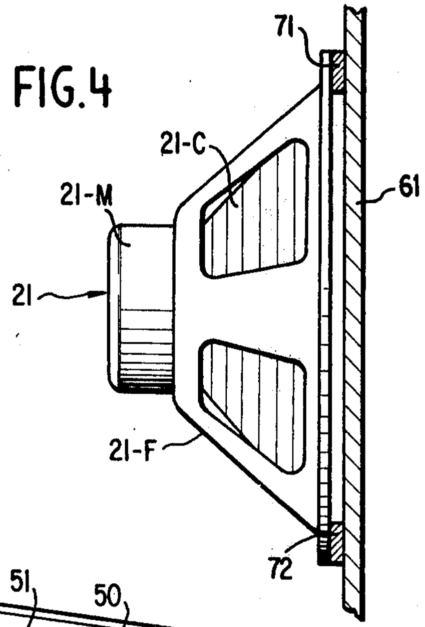
FIG. 4 is a cross-section view of the baffle wall illustrating the attachment of the sound reproduction transducer thereto.
5.

As illustrated in FIG. 4, the first speaker transducer 21 comprises a generally conical speaker frame 21-F having an electromagnet 21-M attached to the apex thereof and a movable cone section 21-C therein. The movable cone section 21-C is made to vibrate or move within the speaker frame 21-F by the operation of the electromagnet 21-M. As the speaker cone 21-C vibrates back and forth to produce the audio energy which is radiated from the speaker in a forward direction, the relative motion between the speaker cone 21-C and the speaker frame 21-F also produces a vibrational energy within the speaker frame 21-F. This vibrational energy is normally dissipated by the action of a vibrational insulator communicating around the circumference of the frame of the speaker between the base of the speaker frame 21-F and the adjoining baffle wall. However, in the present invention this vibrational energy of the speaker frame 21-F is transmitted through vibrational coupling blocks shown as 71 and 72 in FIG. 4, into the apex baffle wall 60. The second speaker transducer 22 is secured in a like manner to the second baffle wall 62.

Therefore, the operation of the speaker transducer 21 produces audio energy which is transmitted in a forward direction from the speaker transducer to be reflected from the adjacent left side member 16 to escape from the speaker cabinet 10 through the front opening 32 thereof. The operation of the first speaker transducer 21 also produces vibrational energy which is closely related to the wavefront energy produced by the speaker cone 21-C, which is then transmitted through the vibrational blocks 71 and 72 to excite selected vibratile modes in the apex baffle wall 60.

These vibrational modes are further transferred from the apex baffle wall 60 through the nodal coupling blocks 50 and 51 or through the baffle edge coupling 65 to excite adjacent ones of the external members of the speaker cabinet 12, 14, 16 and 18. This vibratile energy transferred from the baffle wall 60 may be carefully controlled by the size, placement and spacing between the nodal coupling blocks 52, 54, 56 and 58 as well as 50 and 51. Thus, one skilled in the art may dampen unwanted vibratile modes within the external cabinet members and at the same time may promote desirable vibratile modes within the external cabinet walls by the judicious placement and spacing of the nodal coupling blocks.

Furthermore, the preferred embodiment of the present invention further limits the number and nature of the vibratile modes of the external cabinet members by including on the inside surfaces thereof a plurality of reinforcement ribs shown generally as 74 in FIG. 2. These reinforcing ribs 74 limit certain vibratile modes in specific areas of the external speaker cabinet members. These reinforcing ribs 74 may be varied in size, spacing and location dependent upon the materials used in constructing the speaker cabinet, the dimensions of the isolation slots and the number and spacing of the nodal coupling blocks.

Also, the independent vibratile movement is isolated from the surface upon which the speaker cabinet 10 rests by a plurality of legs 78 spaced generally about the perimeter of the bottom member 14. While in the first preferred embodiment of the present invention the apex baffle wall 60 comprises the two planar baffle walls 61 and 62 coupled at a 90 degree angle to form an apex 63 thereof, it will be understood by one skilled in the art that a curvilinear or other shaped apex baffle wall may be substituted therefor depending upon the overall design parameters required for optimum speaker performance. Therefore, while these first and second baffle walls 61 and 62 are illustrated in FIGS. 2 and 5 as being generally perpendicular to the bottom member 14 and the top member 12 of the speaker cabinet, it will be apparent to one skilled in the art that various curvilinear and other forms of the baffle wall may be chosen depending upon the desired performance parameters of the second reproduction system. While physically paired and electrically parallelled speaker transducers 21 and 22 are recommended, it will be obvious to one skilled in the art that a greater or lesser number of speaker transducers may be used as required by the overall performance parameters specified for the sound reproduction system.

It should be reemphasized at this time that the electro-acoustical efficiency of the speaker transducer and vibratile speaker cabinet combination has been increased by supplementing the direct radiation of acoustical energy from each of the speaker transducers with additional radiation from the external members of the speaker cabinet 12, 14, 16 and 18. The vibratile modes of these external cabinet elements may be theoretically or empirically determined to mask audiable deficiencies in the system or to accentuate desired frequency bandwidths of particular interest. It should also be noted at this point that the top member 12, the bottom member 14, the left side member 16, the right side member 18 as well as the first baffle wall 61 and the second baffle wall 62 of the preferred embodiment of the present invention are formed from a thin plate of spruce or other similar wood or material. The spruce wood has been selected for the preferred embodiment of the present invention because of its tendency to warp. As the spruce members warp, additional stress is distributed throughout each of the external cabinet members. This additional stress contributes to the tonal qualities of the acoustical energy radiated from the external cabinet members responsive to the vibrational energy received from the vibrating frames of the speaker transducers. The reinforcing ribs 74 may be utilized to either accentuate or limit the modes of the stress within the external cabinet members, and thereby influence the vibratile modes set up in the external cabinet members by the vibrational energy therein.

The overall dimensions of each of the external cabinet members is not critical, but it is strongly suggested that the total surface area of the external cabinet members 12, 14, 16 and 18 be sufficient to accurately and efficiently reproduce the lowest frequency desired in the audible frequency band width.

In the first preferred embodiment of the present invention the design of the vibratile speaker cabinet members has been optimized to provide reinforced audible radiation in the bass or low frequency range from the external cabinet members. Therefore, the normally inefficient and limited frequency capabilities of the typical speaker transducers 21 and 22 has been improved with the careful design of the vibratile modes within the external speaker cabinet members as well as the apex baffle walls. Since the first preferred embodiment of the present invention utilizes a rear opening 34 as well as a front opening 32, the acoustical energy radiated from the speaker transducers 21 and 22 will be equal in both the forward and rear directions. With the additional energy radiated from the external speaker cabinet walls, the overall acoustical effect of this speaker approximates an omnidirectional source of acoustical energy.

While for the purposes of description the first preferred embodiment of the invention has been described, it will be apparent to one skilled in the art that changes and modifications can be made therein without departing from the spirit of the invention or the scope of the appended claims. The present invention should not be limited in its application to the details illustrated in the accompanying drawings or the specifications, since it will be understood that the terminology and description employed herein are used solely for the purposes of describing the construction and general operation of the preferred embodiment. Nor should the terminology and descriptions used herein be construed as limitations on the operability of the invention.

I claim:

1. A cabinet for housing sound reproduction transducers of the type having fixed frames and movable cones therein, said cabinet comprising in combination:

a plurality of cabinet members, including a base member, a top member and side members, each positioned to form an external surface of a generally open cabinet which defines therein a cabinet void having a front opening and a rear opening, with each of said cabinet members formed of a relatively thin and acoustically stiff material for moving in a vibratile mode when energized, with adjacent ones of said cabinet members defining therebetween generally continuous isolation slots for permitting the independent vibratile motion of said cabinet members;

a plurality of nodal coupling members, each attached between adjacent ones of said cabinet members for transmitting vibratile energy across said isolation slots, thereby energizing said vibratile modes of each of said cabinet members; and speaker mounting means, located generally within said cabinet void and coupled between the frames of the sound reproduction transducers and at least one of said cabinet members so that the sound reproduction transducers are located within said cabinet void for directionally radiating accoustical energy outwardly through said front and rear openings thereof, said speaker mounting means for coupling the vibrational energy from the frames of the sound reproduction transducers into said cabinet members for energizing said vibratile modes thereof, whereby the audio energy radiated from the sound reproduction transducers will be supplemented by vibratile mode energy radiated from said cabinet members.

2. The cabinet as described in claim 1 wherein said base member, said top member and two of said side members are arranged to form a substantially parallelopiped cabinet.

3. The cabinet as described in claim 1 wherein each of said isolation slots is defined between the end surfaces of adjacent ones of said external cabinet members.

4. The cabinet as described in claim 1 wherein said transducer mounting means comprises in combination:

an apex baffle wall having an apex section and two distended ends, with said apex baffle wall oriented within said cabinet void so that said apex section thereof is adjacent said front opening, with said apex baffle wall extending adjacent to said top member and said bottom member for defining generally continuous internal isolation slots therebetween;

frame coupling means for coupling the vibratile energy from the frame of the sound reproduction transducers to said apex baffle wall; and means for coupling said distended ends of said apex baffle wall to said side members adjacent thereto, whereby the vibratile energy from the frame of the sound reproduction transducers will be transferred to energize the vibratile mode of said apex baffle wall and said external cabinet members.

5. The cabinet as described in claim 4 wherein said frame coupling means comprises a plurality of coupling blocks each rigidly attached at one end thereof to said apex baffle wall and rigidly attached adjacent another end thereof to the frame of the sound reproduction transducer.

6. The cabinet as described in claim 5 wherein said apex baffle wall is generally perpendicular to each of said top member and said bottom member.

7. The cabinet as described in claim 6 further including a plurality of rigid ribs firmly attached to inside surfaces of selected ones of said top member, said bottom member and said side members for limiting the vibratile modes thereof.

8. The cabinet as described in claim 7 further comprising leg means coupled to said bottom member for elevating said bottom member above the surface upon which the cabinet is supported, whereby the vibratile modes of said bottom member will not be dampened by proximity communication with the supporting surface.

9. A cabinet for audio reproduction speakers of the type having fixed frames and movable cones therein, said cabinet comprising in combination:

a plurality of external cabinet members including a base member, a top member and paired side members juxtaposed to form a generally rectangular cabinet which defines therein a generally rectangular void having an open front and rear, with each of said external cabinet members formed of a relatively thin and acoustically stiff material for moving in a vibratile mode when energized, with each end section of adjacent ones of said external cabinet members defining therebetween isolation slots for permitting the independent vibratile motion of said external cabinet members;

nodal coupling members attached to said end sections of adjacent ones of said external cabinet members for transmitting across said isolation slots vibratile energy for energizing said vibratile modes of said external cabinet members; and speaker mounting means, contained within said rectangular void and attached to at least one of said external cabinet members and the speaker frames, for coupling the vibrational energy from the frame of the speakers into said external cabinet members for energizing said vibratile modes thereof, whereby the audio energy radiated from the cone of the transducer will be supplemented by vibratile mode energy from said external cabinet members.

10. The audio speaker cabinet as described in claim 9 wherein said speaker mounting means comprises an apex baffle wall having an apex section and two distended ends, with said apex baffle wall oriented within said rectangular void so that said apex section thereof is adjacent to said front opening, with said apex baffle wall extending adjacent to said top member and said bottom member for defining internal isolation slots therebetween.

* * * * *

UNITED STATES PATENT AND TRADEMARK OFFICE

CERTIFICATE OF CORRECTION

PATENT NO. : 4,147,229

DATED : April 3, 1979

INVENTOR(S) : Arthur L. Flashman

It is certified that error appears in the above-identified patent and that said Letters Patent are hereby corrected as shown below:

Column 3, line 36, delete "said" and insert -- side --:

Signed and Sealed this

*Twentieth* Day of *November 1979*

[SEAL]

*Attest:*

RUTH C. MASON
*Attesting Officer*

LUTRELLE F. PARKER
*Acting Commissioner of Patents and Trademarks*